(12) United States Patent
Yamada

(10) Patent No.: US 11,380,401 B2
(45) Date of Patent: *Jul. 5, 2022

(54) HIGH-VOLTAGE SHIFTER WITH REDUCED TRANSISTOR DEGRADATION

(71) Applicant: Micron Technology, Inc., Boise, ID (US)

(72) Inventor: Shigekazu Yamada, Suginamiku (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/240,358

(22) Filed: Apr. 26, 2021

(65) Prior Publication Data

US 2021/0249084 A1  Aug. 12, 2021

Related U.S. Application Data

(63) Continuation of application No. 16/813,273, filed on Mar. 9, 2020, now Pat. No. 10,998,050, which is a
(Continued)

(51) Int. Cl.
*G11C 16/12* (2006.01)
*G11C 16/10* (2006.01)
(Continued)

(52) U.S. Cl.
CPC .......... *G11C 16/12* (2013.01); *G11C 16/0408* (2013.01); *G11C 16/0466* (2013.01);
(Continued)

(58) Field of Classification Search
CPC . G11C 16/12; G11C 16/0408; G11C 16/0466; G11C 16/107; G11C 16/14;
(Continued)

(56) References Cited

U.S. PATENT DOCUMENTS

| 4,829,296 A | 5/1989 | Clark et al. |
| 6,236,617 B1* | 5/2001 | Hsu .......................... G11C 8/08 365/230.06 |

(Continued)

FOREIGN PATENT DOCUMENTS

WO  WO-2020159870 A1  8/2020

OTHER PUBLICATIONS

"International Application Serial No. PCT/US2020/015211, International Search Report dated May 21, 2020", 3 pgs.
(Continued)

*Primary Examiner* — Jay W. Radke
(74) *Attorney, Agent, or Firm* — Schwegman Lundberg & Woessner, P.A.

(57) ABSTRACT

Discussed herein are systems and methods for protecting against transistor degradation in a high-voltage (HV) shifter to transfer an input voltage to an access line, such as a global wordline. An embodiment of a memory device comprises memory cells and a HV shifter circuit that includes a signal transfer circuit, and first and second HV control circuits. The signal transfer circuit includes a P-channel transistor to transfer a high-voltage input to an access line. The first HV control circuit couples a bias voltage to the P-channel transistor for a first time period, and the second HV control circuit couples a stress-relief signal to the P-channel transistor for a second time period, after the first time period, to reduce degradation of the P-channel transistor. The transferred high voltage can be used to charge the access line to selectively read, program, or erase memory cells.

20 Claims, 13 Drawing Sheets

Related U.S. Application Data continuation of application No. 16/259,671, filed on Jan. 28, 2019, now Pat. No. 10,586,600.

(51) Int. Cl.
  *G11C 29/02* (2006.01)
  *G11C 16/04* (2006.01)
  *G11C 16/14* (2006.01)

(52) U.S. Cl.
  CPC ............ *G11C 16/107* (2013.01); *G11C 16/14* (2013.01); *G11C 29/021* (2013.01)

(58) Field of Classification Search
  CPC .................. G11C 29/021; G11C 5/145; G11C 2029/0411; G11C 5/08; G11C 8/08; G11C 16/30; G11C 16/32; G11C 16/349; G11C 29/52; G11C 16/08
  See application file for complete search history.

(56) References Cited

U.S. PATENT DOCUMENTS

| | | | |
|---|---|---|---|
| 7,512,008 B2 | 3/2009 | Chan et al. | |
| 7,848,151 B2 | 12/2010 | chan et al. | |
| 10,308,382 B2 | 6/2019 | Payne | |
| 10,586,600 B1 | 3/2020 | Yamada | |
| 10,998,050 B2 | 5/2021 | Yamada | |
| 2005/0068836 A1* | 3/2005 | Oh | G11C 8/08 365/229 |
| 2006/0062070 A1 | 3/2006 | Sibigtroth et al. | |
| 2009/0168586 A1 | 7/2009 | Chan et al. | |
| 2009/0185422 A1 | 7/2009 | Kang et al. | |
| 2009/0268526 A1* | 10/2009 | Nakano | G11C 16/08 365/185.18 |
| 2011/0199837 A1* | 8/2011 | Reohr | G11C 11/4085 365/189.11 |
| 2011/0205829 A1* | 8/2011 | Iida | G11C 8/08 365/230.06 |
| 2014/0015587 A1 | 1/2014 | Chen et al. | |
| 2014/0328122 A1* | 11/2014 | Barth, Jr. | G11C 11/4085 365/182 |
| 2016/0164497 A1* | 6/2016 | Agarwal | H01L 27/0266 327/437 |
| 2017/0301402 A1 | 10/2017 | Kuribara et al. | |
| 2018/0308530 A1* | 10/2018 | Kim | G11C 8/14 |
| 2020/0111521 A1* | 4/2020 | Kim | G11C 11/4096 |
| 2020/0185021 A1* | 6/2020 | Lu | G11C 29/50012 |
| 2020/0243142 A1 | 7/2020 | Yamada | |

OTHER PUBLICATIONS

"International Application Serial No. PCT/US2020/015211, Written Opinion dated May 21, 2020", 4 pgs.

"International Application Serial No. PCT US2020 015211, International Preliminary Report on Patentability dated Aug. 12, 2021", 6 pgs.

* cited by examiner

HIGH-VOLTAGE SHIFTER WITH REDUCED TRANSISTOR DEGRADATION

PRIORITY APPLICATION

This application is a continuation of U.S. application Ser. No. 16/813,273, filed Mar. 9, 2020, which is a continuation of U.S. application Ser. No. 16/259,671, filed Jan. 28, 2019, now issued as U.S. Pat. No. 10,586,600, all of which are incorporated herein by reference in their entirety.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

During a typical programming operation of a flash memory cell (e.g., a NAND flash memory), a selected word line coupled to the selected memory cell to be programmed can be biased with a series of incrementing voltage programming pulses that start at an initial voltage that is greater than a predetermined programming voltage ($V_{PGM}$). The programming pulse increases a charge level, thereby increasing the cell threshold voltage Vth, on a floating gate of the memory cell. A charge pump circuit may be used in a non-volatile memory device such as a NAND flash memory to generate the voltages required for chip operation. A charge pump is an electronic circuit that uses capacitors as energy storage elements to convert DC voltages into other DC voltages. After each programming pulse, a verification operation with a word line voltage of 0V is performed to determine if the cell threshold voltage has increased to the desired programmed level.

High-voltage (HV) shifters, or HV level shifters, have been used in various memory devices (e.g., NAND flash memory) to provide desired voltages at different magnitude to selectively operate a memory cell, such as read, program, or erase a memory cell. In a memory device, components or subcircuits may have different voltage requirements to fulfill respective functions. A HV shifter may serve as an interface between different logic device components to translate signals from one logic level or voltage domain to another logic level of voltage domain, thereby enabling compatibility among the voltage levels of different components or subcircuits. Providing appropriate operating voltages to specific circuit components can increase reliability of a memory device and decrease power consumption. In an example, a HV level shifter circuit may be used to translate a block wordline (WL) signal of a high voltage to different memory array blocks, such as in response to a block selection signal. In response to the block WL signal received from the HV level shifter, driving voltages may be provided to the WLs corresponding to various memory cell array block. An exemplary application of HV level shifters to translate a high-voltage input to one or more WLs is discussed in FIG. 5 below.

Figure 6:
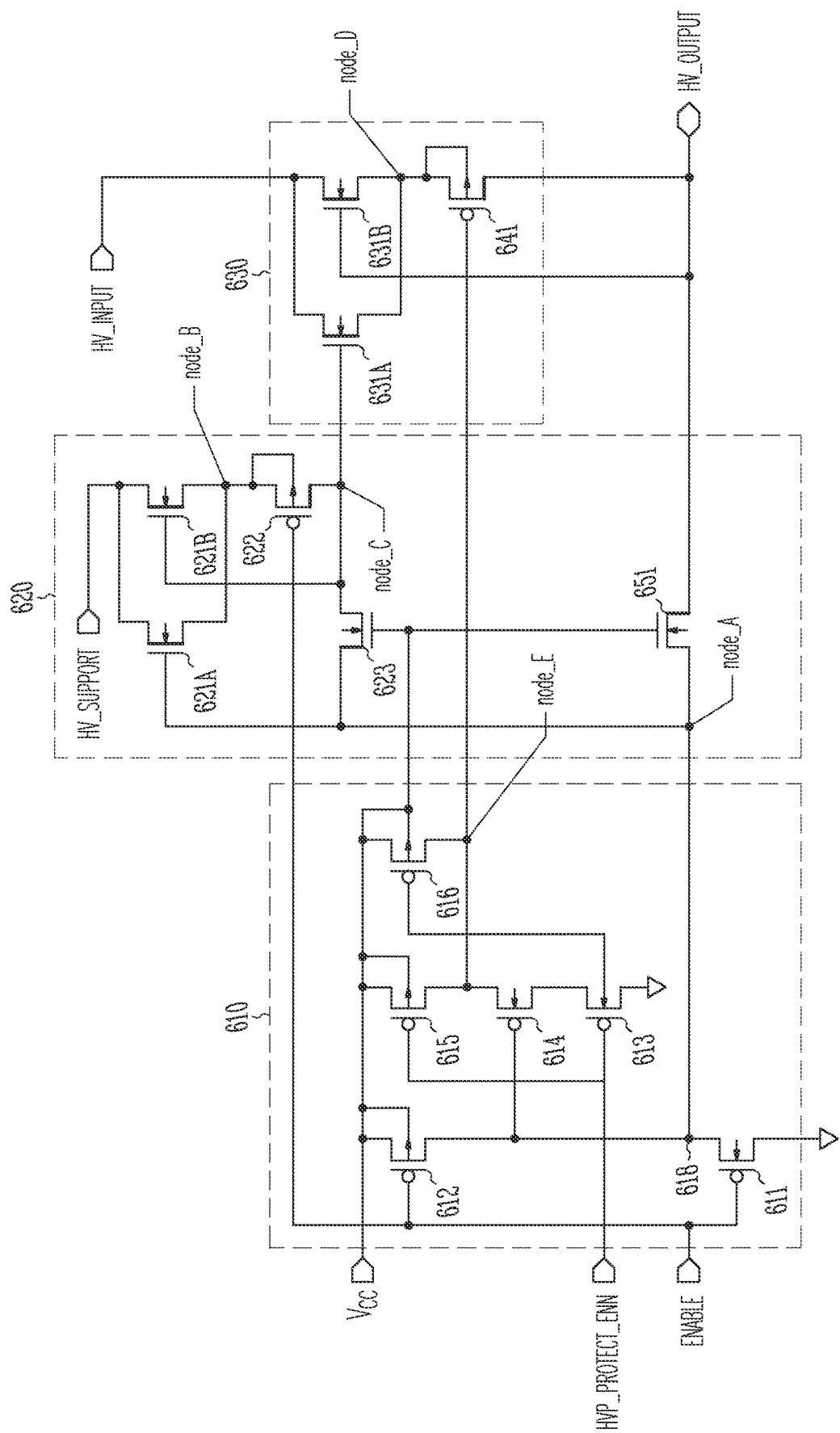
FIG. 6 is a schematic diagram illustrating a prior art high-voltage (HV) shifter 600.

In today's 3D NAND flash memory, the required number of HV shifters is increasing, as the high-voltage supply system gets complicated. Reducing HV shifter size and complexity (e.g., reducing the number of transistors in a HV shifter), and thereby reducing chip layout area and die size, have become an important requirement in modern memory device design. One of the technological challenges in reducing HV shifter size and complexity has to do with a degradation of sensitive transistors in a HV shifter. For example, FIG. 6 is a schematic diagram illustrating a prior art high-voltage shifter that includes a number of HV transistors. Some of these HV transistors, such as high-voltage PMOS transistors (HVP's) on a path between an input port for receiving a high-voltage input and an output port connecting to an access line, are under a high-voltage stress. Some transistors may degrade after many cycles of repetitive use. For example, under the stress imposed by a high gate-to-channel voltage gradient (also referred to as "V_gate–V_channel" stress), a HVP can degrade, represented by an increased threshold voltage (Vth) over time. To compensate for such a degradation, many components are included in the HV shifter. This may take more chip space and increase HV shifter complexity and cost.

The present inventor has recognized an improved solution to transistor degradation in a HV shifter, including a HV shifter circuit, and methods of using the same, that can reduce, and in some cases prevent, degradation of HV transistors in a HV shifter circuit, while at the same reducing the components and complexity of the shifter and overall size of a chip. In various embodiments, this document discusses, among other things, a memory device comprising a group of memory cells, and a HV shifter circuit including a signal transfer circuit, and first and second HV control circuits. A P-channel transistor of the signal transfer circuit can transfer a high-voltage input to an access line. The first HV control circuit can couple a bias voltage to the P-channel transistor for a first time period. After the first time period, the second HV control circuit can couple a stress-relief signal to the P-channel transistor for a second time period to protect the P-channel transistor against degradation. The transferred high voltage can be used to charge the access line to selectively read, program, or erase memory cells. Methods of forming such apparatus are also disclosed, as well as methods of operation, and other embodiments.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 1:
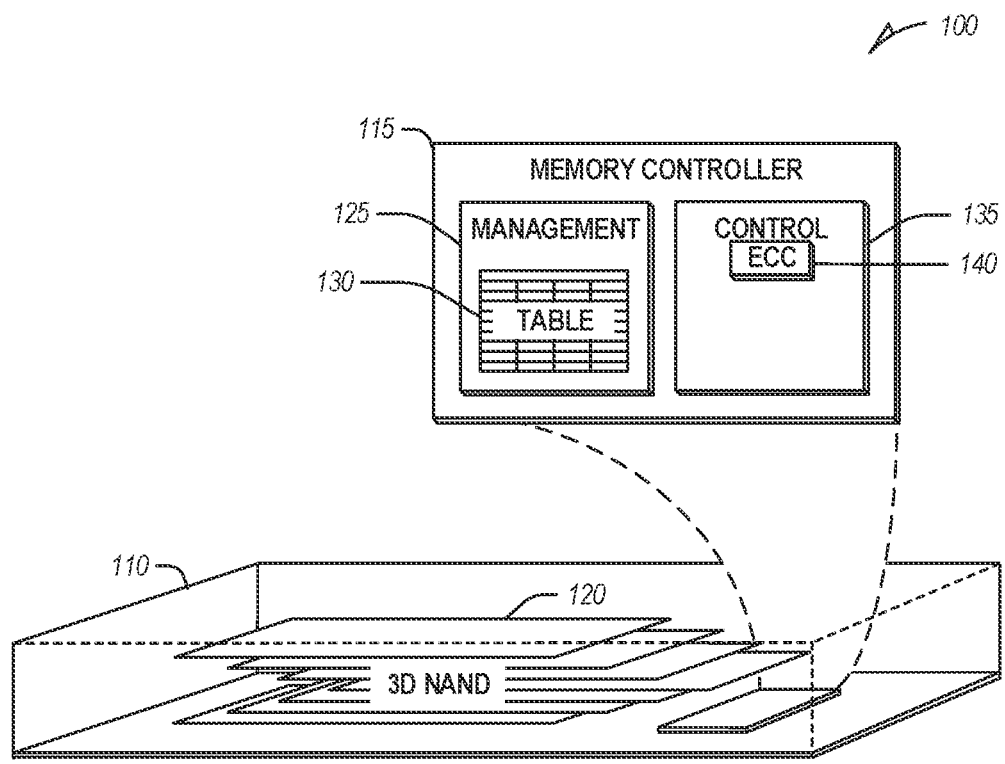
FIG. 1 illustrates an example of an environment including a memory device.

FIG. 1 illustrates an example of a memory device 110 that may be included in a variety of products, such as Internet of Things (IoT) devices (e.g., a refrigerator or other appliance, sensor, motor or actuator, mobile communication device, automobile, drone, etc.) to support processing, communications, or control of a product. The memory device 110 includes a memory controller 115 and a memory array 120. The memory array 120 may include a number of individual memory die (e.g., a two-dimensional (2D) NAND die, or a stack of three-dimensional (3D) NAND die). The memory arrays 120 can be 2D structures arranged on a surface of a semiconductor substrate. To increase memory capacity for a given area, and to decrease cost, the size of the individual memory cells has decreased. Alternatively, memory arrays 120 can be 3D structures, such as 3D NAND memory devices that can further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of a host device. In other examples, the memory device 110 can be a portion of an integrated circuit (e.g., system on a chip (SOC), etc.), stacked or otherwise included with one or more other components of a host device.

The memory controller 115 can communicate with the memory array 120, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between a host and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between a host and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
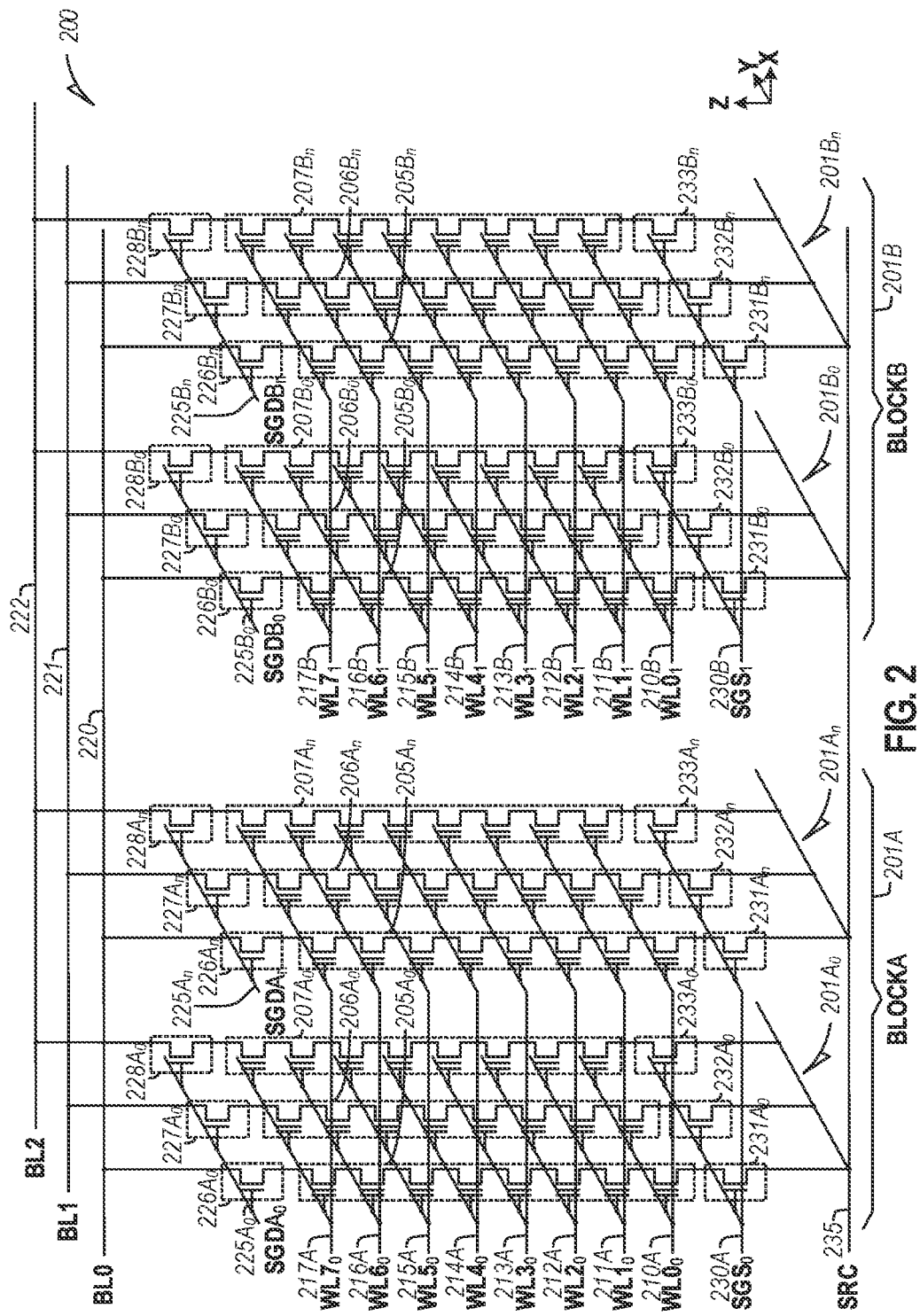
FIGS. 2-3 are schematic diagrams illustrating examples of NAND architecture semiconductor memory array.

FIG. 2 is a schematic diagram illustrating an example of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ 225$A_0$, first-third $A_n$ SGD $226A_n$-$228A_n$ can be accessed using an SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed via a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., WLs).

Figure 3:
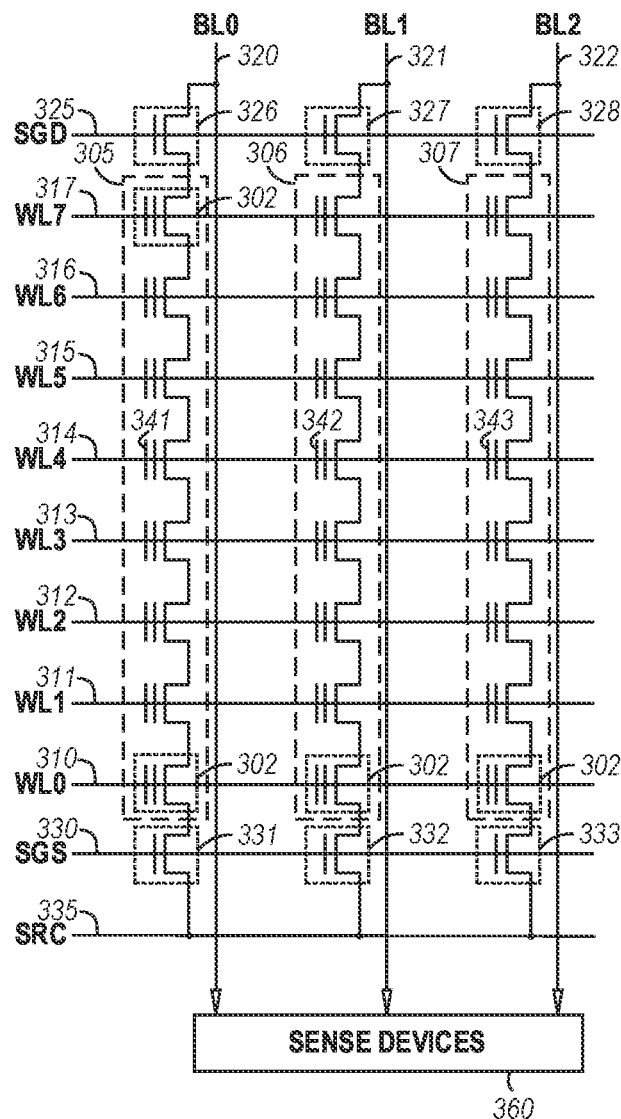

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential Vss, can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage ($V_{PASS}$) can be applied to one or more word lines having memory cells that are not targeted for programming, or an inhibit voltage (e.g., Vcc can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential Vss.

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground Vss, resulting in a charge transfer (e.g., direct injection or Fowler-Nordheim (FN) tunneling, etc.) from the floating gates of the targeted memory cells to the channels.

Figure 4:
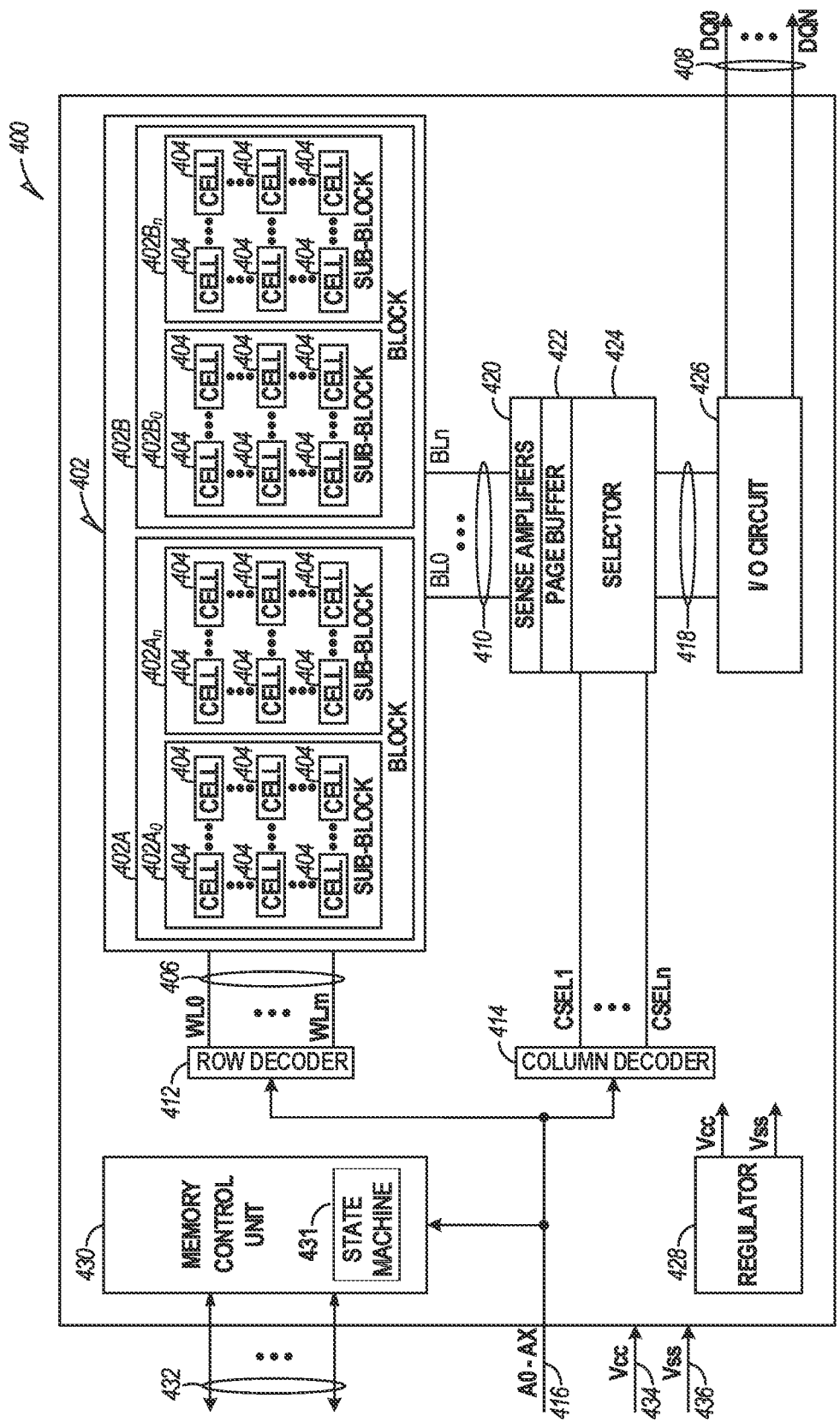
FIG. 4 is a block diagram illustrating an example of a memory module.

FIG. 4 is a block diagram illustrating an example of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 may include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage Vcc 434 and a ground potential Vss 436, from an external source or supply (e.g., an internal or external battery, an AC-to-DC converter, etc.). In certain examples, the memory control unit 430 can include a regulator 428 to internally provide positive or negative supply signals.

Figure 5:
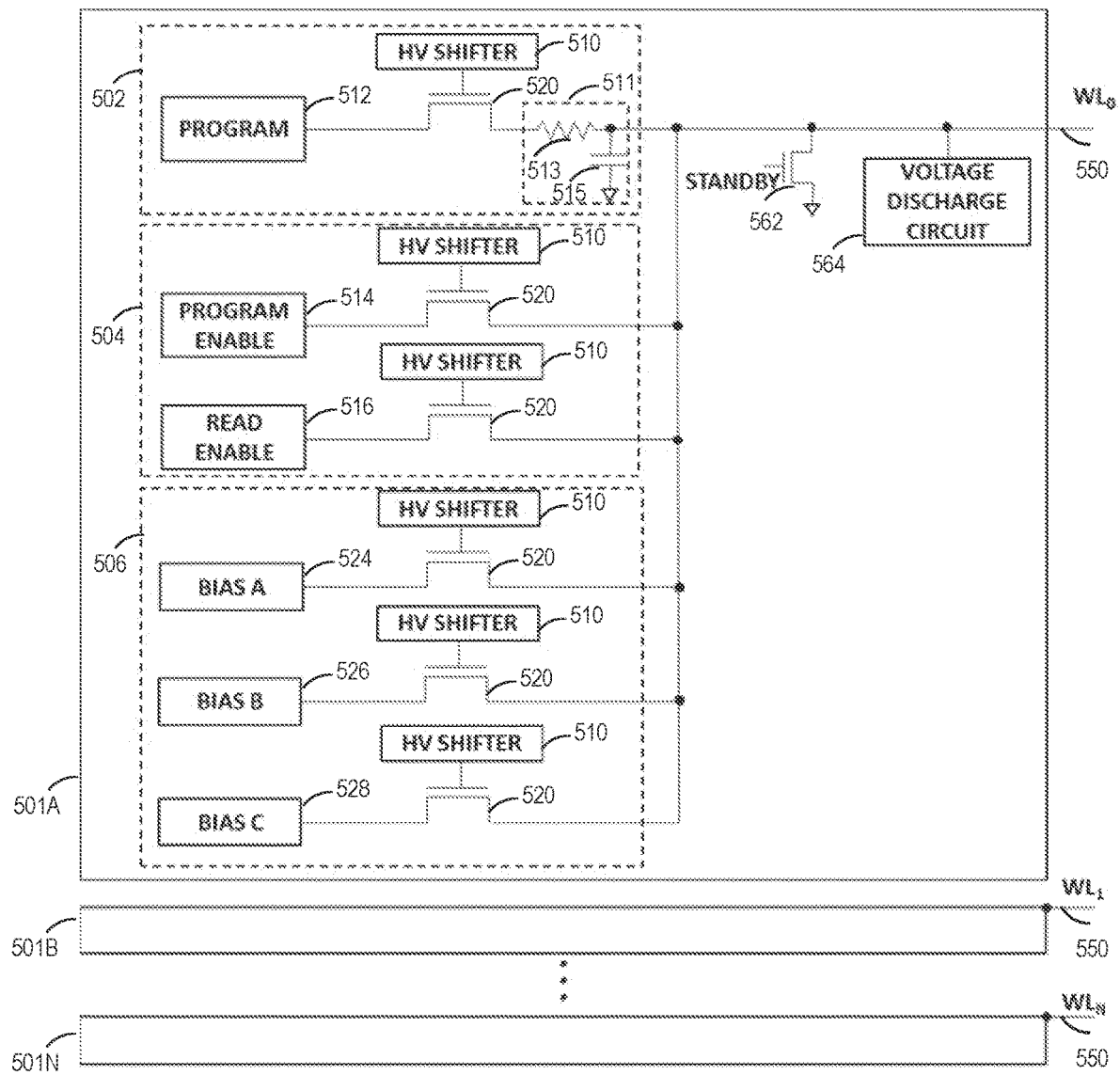
FIG. 5 is a block diagram illustrating prior art word line (WL) drivers in a row decoder.

In various examples, a row decoder of a memory device, such as the row decoder 412 of FIG. 4, may include high-voltage (HV) shifters configured to translate supply voltage of specific magnitudes to access lines (e.g., a global word line (GWL)) of memory cells. FIG. 5 is a block diagram illustrating an example of prior art word line (WL) drivers 501A-501N in a row decoder. The WL drivers 501A-501N can be provided for all of the WLs 550 in a block. Each WL driver can include a HV shifter to couple one of several possible voltages to a respective WL to program, erase, or read the memory cells in the respective row. Taking WL driver 501A as an example, each WL driver can include several voltage nodes 512-528 configured to receive a supply voltage having a respective magnitude. The voltage nodes 512-528 are coupled to the respective WL 550 through a switch 520 enabled in accordance with the operation of the selected row of memory cells. The switches 520 can be NMOS transistors controlled by a HV shifter 510, such as a charge pump circuit (not shown) or by other means known to one skilled in the art. When enabled, the HV shifter 510 provides a voltage to turn ON the transistor switch 520 and couple the respective voltage nodes 512-528 to the selected WL 550. Additionally, each WL driver can include a standby switch 562 and a voltage discharge circuit 564 coupled to the WL 550. The standby switch 562 is enabled when the memory block is inactive, and disabled when the memory block receives a command for a memory operation. The voltage discharge circuit 564, which conventionally includes a high impedance for causing any voltage capacitively stored on the respective WL 550, including voltage stored on capacitors coupled to the WL 550 such as a capacitor 515, to be discharged after a memory operation is complete to prepare for the next command.

The WL driver 501 includes a program block 502 to apply a programming voltage to one of the WL 550 selected for programming during a programming operation, a read block 506 to apply one of several read voltages to a WL 550 selected for reading during a read operation, and an enable block 504 to apply one of two enable voltages to a non-selected WL 550 during either a programming or reading operation. The program voltage supplied by the program block 502 must be sufficiently large to store charge on the floating gate when the selected memory cell is programmed. When the switch 520 is enabled, the program node 512 is serially connected to a resistor 513 and a capacitor 515, which in combination act as a low pass filter 511 that filters the supplied voltage before the voltage is applied to the WL 550. The low pass filter 511 is used as a delay element to minimize disturbances due to WL-to-WL coupling when the signal applied to the WL 550 transitions to a high voltage level or a low voltage level. During the program operation, the enable block 504 applies a program enable voltage from the program enable node 514 to a respective one of the WLs 550 that is not selected for programming. As described above, a voltage sufficient to turn on all the unselected memory cells 14 must be applied to the WLs 550 of the other rows to program the selected row.

Similarly, during a read operation, the read block 506 applies a read voltage to a respective WL 550 that is selected for reading. Since the memory cell is capable of storing multiple bits of data at multiple levels of charge on its floating gate, several read voltages are made available through one or more bias voltage nodes 524-528. During the read operation, the enable block 504 applies a read enable voltage from the read enable node 516 to a respective one of the WLs 550 if the WL is not selected for reading to turn on the memory cells 14 of the non-selected rows as previously described.

As mentioned above, respective WL drivers 501A-501N are provided for all of the WLs 550 in a block. For example, for a block containing 32 rows of memory cells, 32 WL drivers 501 must be provided. The area on a semiconductor die that must be devoted to such WL drivers is further increased by the use of the multilevel memory cell in the flash memory block, since more voltage levels must be supplied by each of the WL drivers as more bits are stored in the memory cells. Specifically, each additional voltage that is supplied requires an additional voltage node to incorporate in the WL driver 501 circuitry or by some other circuitry. Therefore, as the number of read voltages supplied to the select memory cells increases, each of the drivers 501 require additional circuitry. Therefore, the memory chip must accommodate a greater number of the larger drivers 501, resulting in a large chip layout area and a large die size. The large number of components can require a significant amount of area on a semiconductor die, thus increasing the cost of non-volatile memory devices having row decoders that use the WL drivers 501. Therefore, there has been an unmet need for a non-volatile memory device and method that reduces the circuit size of the WL drivers 501 to reduce the overall memory chip layout area and die size.

As previously discussed, one challenge in the HV shifter design is degradation of sensitive transistors due to substantial gate-to-channel stress applied thereto. Compensation of such degradation typically require a large number of transistors in the HV shifter, which take more chip area and increase HV shifter complexity and cost. By way of example, FIG. 6 is a schematic diagram illustrating a prior art HV shifter 600 used for translating an input voltage received from an input port to an output port coupled to one or more access lines, such as a GWL or a WL in a block, to selectively read, program, or erase memory cells.

The HV shifter 600 includes a low-voltage control circuit 610, a compensator circuit 620, and a signal transfer circuit 630. The low-voltage control circuit 610 includes low-voltage transistors, including for example, PMOS transistors 612, 615, and 616, and NMOS transistors 611, 613, and 614. A supply voltage Vcc and a shifter enabling signal "enable" can be applied to the low-voltage control circuit 610 to control the conduction of the transport circuit 630, and thereby the output voltage of the HV shifter 600. In particular, the "enable" signal is connected to the gates of the NMOS 611 and of the PMOS 612 that constitute an inverter. The NMOS 611 has a source connected to a ground potential Vss, and the PMOS 612 has a source connected to a supply voltage Vcc. The output of said inverter, forming a node 618, is connected to the gates of the NMOS 614 and of the PMOS 615. The PMOS 615 has a source connected to Vcc, and a drain connected to the drain of NMOS 614. A compensator-enabling signal "HVP_protect_enn" is coupled to the gates of the NMOS 613 and of the PMOS 616 to control the delivery of a compensation signal, generated by the compensator circuit 620, to the signal transfer circuit 630. The PMOS 616 has a source connected to Vcc. and a drain connected to the drain of the NMOS 614. The PMOS 615, NMOS 614, and NMOS 613 are serially connected and coupled between Vcc and Vss.

The compensator circuit 620 includes high-voltage transistors, such as a pair of high-voltage NMOS transistors HVD 621A and HVD 621B each having a negative threshold voltage (Vth), high-voltage NMOS transistors HVN 623 and HVN 651 each having positive Vth, and a high-voltage PMOS transistor (HVP) 622. The HVD 621A and 621B have a Vth of approximately −1.5V. The HVN 623 and 651 are normal high-voltage NMOS transistors each having a positive Vth of approximately 0.8V. The HVP 622 has a positive Vth of approximately 1.5V. A high-voltage support signal "HV_support" can be supplied to the drains of the HVD 621A-621B. The sources of HVD 621A-621B are connected to the source of the serially connected HVP 622. The HV_support, through the HVD 621A-621B and HVP 622, provides a compensation signal to the signal transfer circuit 630 to compensate for transistor degradation therein.

The signal transfer circuit 630 can include a pair of high-voltage NMOS transistors (HVD) 631A and 631B each having a negative threshold voltage (Vth), and a HVP 641 serially connected to the HVD 631A-631B and coupled between a high-voltage input signal "HV_input" and an output node "HV_output." The HVD 631A-631B each have a Vth of approximately −1.5V. The HVP 641 has a positive Vth of approximately 1.5V. The drains of HVD 631A-631B are coupled to the HV_input signal. The drain of HVP 641 is connected to HV_output. The signal transfer circuit 630 couples the compensation signal to HVP 641 to compensate for degradation associated with an elevated threshold voltage (Vth) of HVP 641, due to the substantial gate-to-channel stress. Degradation can occur when a transistor, such as a high-voltage PMOS transistor (HVP) 641, operates under a high-voltage gate-to-channel stress. A representation of transistor degradation is an increased threshold voltage (Vth). With the increased Vth, the degraded transistor (e.g., HVP 641) may not be able to fully transfer the high input voltage (HV_input) to the output (HV_output) of the HV shifter, and then to the access lines (e.g., GWLs or WLs) to selectively operate on the memory cells. For example, in the absence of degradation, a biasing voltage of Vcc less the Vth of a high-voltage NMOS transistor (HVD) 631A or 631B (that is. Vcc−1.5V) may be sufficient to cause the HVD 631A-631B and HVP 641 conductive, due to the negative threshold voltages of HVD 631A-631B and of HVP 641 (which are approximately −1.5V). Keeping a relatively lower biasing voltage is desirable to protect the low-voltage transistors in the low-voltage control circuit 610 from breakdown. However, when HVP 641 becomes degraded and the Vth of HVP 641 has increased, the biasing voltage Vcc-1.5V would not be high enough turn on HVD 631A-631B and HVP 641 to reliably transfer full input voltage to the output port. As such, to compensate for degradation of HVP 641, a higher gate voltage may be required to operate the degraded transistor.

Figure 7:
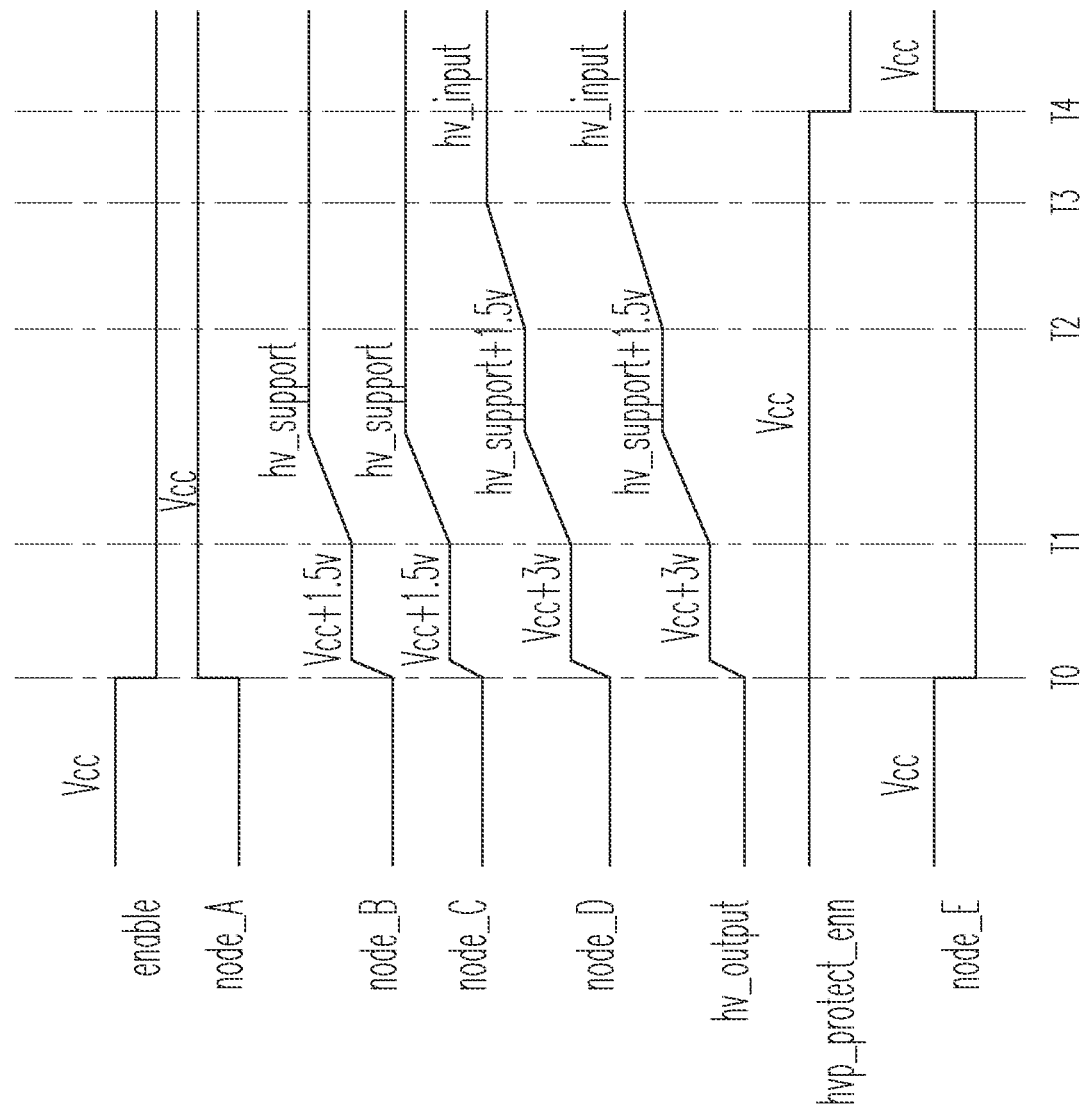
FIG. 7 is a timing diagram illustrating an operation of the HV shifter 600, including the voltage level shifting and compensation of transistor degradation.

FIG. 7 is a timing diagram illustrating an operation of the HV shifter 600, including the voltage level shifting and compensation of transistor degradation. Initially during the standby state, the shifter enabling signal "enable" is set to high at Vcc. The "enable" signal is coupled to the gate of the NMOS 611 and the PMOS 612 of the low-voltage control circuit 610, turning on NMOS 611 and shutting off PMOS 612. Node 618, and node_A, connected to the drain of NMOS 611, are pulled to a ground potential Vss. The transistor HVN 623 has its gate connected to Vcc and drain connected to node_A. As HVN 623 conducts, node_C, which is connected to the source of HVN 623, is also low (Vss). Node_A is connected to the gate of HVD 621A, and node_C is connected to the gate of HVD 621B. When both node-A and node_C are low, HVD 621A-621B do not conduct. The sources of HVD 621A-621B, connected to node_B, are disconnected from HV_support connected to the drains of HVD 621A-621B, HVP 622 has a gate connected to "enable" (at a level of Vcc), thus does not conduct. As such, node_B stays at ground potential Vss.

Node-C is connected to the gate of HVD 631A-631B. The ground potential Vss at node_A is transferred to HV_ouput via a high-voltage NMOS transistor (HVN) 651 that conducts. The transferred low voltage is applied to the gate of HVD 631B. Because both node_A and node-C are low, HVD 631A-631B are not conducting. Node_D, connected to the sources of HVD 631A-631B, is disconnected from HV_input; therefore, node_D stays at ground Vss. The low voltage at node 618, connected to a gate of PMOS 615, turns on PMOS 615, setting node_E (connected to the drain of PMOS 615) to a logic high at Vcc.

At time T0, the "enable" signal is flipped to low (the ground potential Vss) to enable the HV shifter. NMOS 611 is turned off and PMOS 612 is turned on, and node_A is raised to high at Vcc, HVD 621A thus conducts. As the HVD 621A has a negative threshold voltage (approximately −1.5V), the source of HVD 621A, connected to node_B, thus is raised to Vcc+1.5V. This is shown as the first voltage rise at node_B. HVP 622 conducts due to low gate voltage (connected to "enable"), which brings node_C to follow node_B, shown as the first voltage rise at node_C to Vcc+1.5V. The gates of HVD 621A-621B are connected to node_A and node_C, respectively, HVD 621A-621B each have a negative threshold voltage (Vth, approximately −1.5V). As HVD 621A-621B conduct, the sources of HVD 621A-621B (connected to node_D) is raised to a level of higher than the gate voltage (connected to node_C) by 1.5V. As node_C is Vcc+1.5V, the voltage at node_D is approximately Vcc+3V.

The high voltage at node_A is connected to the gate of NMOS 614 to turn on NMOS 614. At this time, the compensator-enabling signal HVP_protect_enn is set to high, turning on the NMOS 613. Therefore, node_E is at a ground potential Vss, HVP 641 has its gate connected to node_E, therefore conducts. Node_D is connected to the source of HVP 641, and HV_output is connected to the drain of HVP 641. The output voltage HV_ouput therefore follows node_D, reaching a potential of approximately Vcc+3V.

As HVD 621A-621B conduct, HV_support can be transferred down the path in the compensator circuit 620. From time T1, the voltage at node_B rises from Vcc+1.5V until HV_support is fully transferred, and raise node_B to HV_support. As HVP 622 still conducts, node_C follows node_B to rise to HV_support. This is shown in FIG. 7 as the second voltage rise at node_C and node_D to HV_support. As previously discussed, HVD 631A conducts, resulting in voltage of node_D (connected to the source of HVD 631A) being higher than the voltage at node_C (connected to the gate of HVD 631A) by Vth of HVD 631A. Therefore, when node_C rises from Vcc+1.5V to HV_support, node_D accordingly rises from Vcc+3.0V to HV_support+1.5V. The output voltage HV_ouput, via the conducted HVP 641, follows node_D voltage to rise to HV_support+1.5V. This is shown as the second voltage rise at node_D and HV_output to HV_support+1.5V.

As HVD 631A-631B conduct, HV_input can be transferred to down the path at the signal transfer circuit 630 node_D. Following a latency period when node_D reaches HV_support+1.5V, at time T2, the voltage at node_D can further rise from HV_support+1.5V until HV_input is fully transferred to node_D at time T3. The output voltage HV_ouput follows node_D voltage to rise to HV_input. This is shown as the third voltage rise at node_D and HV_support to HV_input.

HV_input can be selected according to memory cell operations. For example, when the HV shifter 600 is used to supply the HV_output to a word-line (e.g., a GWL) to read or program a memory cell, HV_input can be approximately 7-10V for reading a memory cell, or approximately 20-30V for programming a memory cell.

Transferring the high voltage HV_input through HVP 641 to HV_ouput to fulfill various high-voltage operations on the memory cells may subject HVP 641 to high-voltage "gate-to-channel" stress. This may elevate the threshold Vth and degrade the performance of HVP 641. FIG. 7 illustrates a solution to release the stress on HVP 641. After a prolonged voltage transfer through HVP 641, at time T4, HVP_protect_enn is reset to low at Vss. PMOS 616, with its base connected to HVP_protect_enn and drain connected to node_E, conducts and raises the drain (and thus node_E) voltage to Vcc. The Vcc supplied to the gate of HVP 641 can relax the stress due to high-voltage transfer.

The prior art HV shifter 600 has several disadvantages. First, as illustrated in FIG. 7, after HV_input has been fully transferred to HV_output through HVP 641, the gate of HVP 641 (at node_E) is switched to Vcc for the purpose of relaxing the stress applied to HVP 641. However, even with such relaxing, as HV_input remains to be high (e.g., approximately 30V), HVP 641 can continue degrade due to very high HV_input applied to HVP 641. Second, the HV shifter 600 comprises a large amount of high-voltage transistors, which take a lot of space and result in a large die size. To combat PMOS degradation, the compensator circuit 620 is included to compensate for the increased threshold voltage of HVP (e.g., HVP 641). Although HV_support higher than Vcc is able to turn on the degraded HVP 641 with an elevated Vth, the compensator circuit 620 comprises many high-voltage transistors (HVN 623, HVD 621A-621B, and HVP 622), which can increase the size, complexity, and cost of the HV shifter. Some of these high-voltage transistors are vulnerable to gate-to-channel stress particularly at high HV_support. As such, HV_support in HV shifter 600 is usually designed to be low enough (e.g., approximately 7V in an example) not to degrade HVP. Third, conventional HV shifters, such as the shifter 600, lacks resource sharing and may results in a large chip size. In a 3D NAND memory chip, there are usually many high-voltage sources and many word-lines. As illustrated in FIG. 5, each WL driver (for driving a particular WL) requires a number of dedicated HV shifters. Eventually, a large number of HV shifters need to be implemented in a chip, which may substantially increase the chip size. For at least foregoing reasons, there is a need for a HV shifter with improved performance of compensating, or reducing, degradation of a transistor such as a high-voltage, while at the same time reducing the circuit size and complexity of the HV shifter, such that the overall chip layout area and die size can be reduced.

Figure 8:
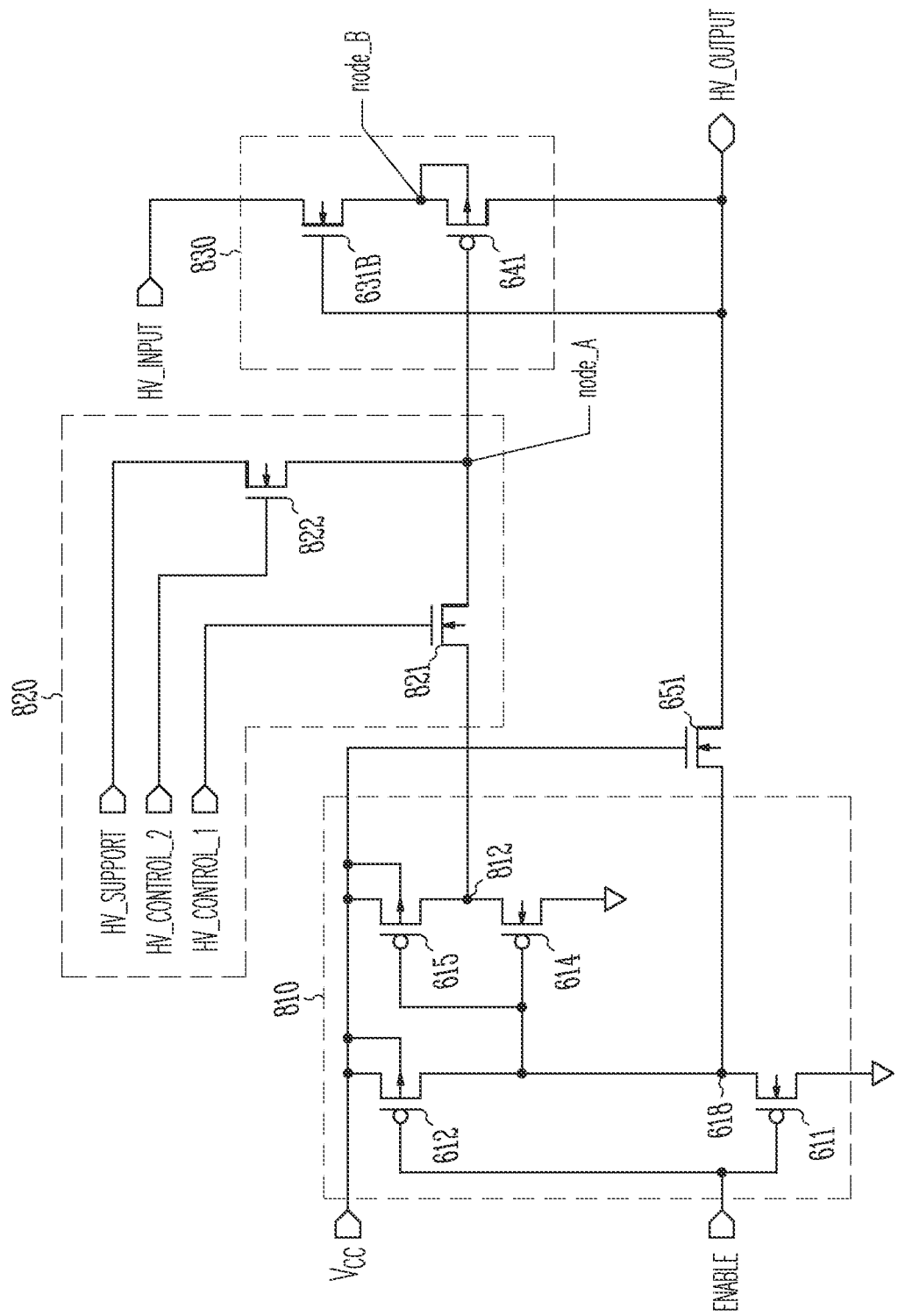
FIG. 8 is a schematic diagram illustrating an example of a HV shifter 800 with reduced transistor degradation, according to one embodiment discussed herein.

FIG. 8 is a schematic diagram illustrating an example of HV shifter 800 with reduced transistor degradation, according to one embodiment the subject matter discussed herein. The HV shifter 800 improves over the prior art HV shifter 600 with more effective protection against degradation of a transistor (e.g., HVP 641) using substantially fewer transistors, and can therefore reduce the size and complexity of the HV shifter.

The HV shifter 800 can include a low-voltage control circuit 810, a transistor protector circuit 820, and a signal transfer circuit 830. The low-voltage control circuit 810 is an improved variant of the low-voltage control circuit 610 of FIG. 6. Among other things, low-voltage transistors 613 and 616, and the compensator-enabling signal input HVP_protect_enn, are removed from the low-voltage control circuit 810. Protection of the PMOS against degradation can instead be fulfilled by the transistor protector circuit 820, which replaces the compensator circuit 620 of the HV shifter 600 in FIG. 6. The transistor protector circuit 820 includes two control voltage signals HV_contorl_1 and HV_contorl_2 and a high-voltage support signal HV_support. The HV_contorl_1 signal can be coupled to a gate of a high-voltage NMOS transistor (HVN) 821. The HV_control_2 signal can be coupled to a gate of another HVN 822. The HV_support signal can be connected to the drain of the HV 822, HVN 821 and HVN 822 take the place of the five HV transistors (HVD 621A-621B, HVN 623, HVP 622, and HVD 631A) of the compensator circuit 620 of the HV shifter 600 in FIG. 6. In contrast to the compensator circuit 620 that compensates for transistor (e.g., HVP 641) degradation that has occurred (e.g., an increased threshold voltage of HVP 641) via the HV_support, the transistor protector circuit 820 can be configured to protect the HV transistor (e.g., HVP 641) of the signal transport circuit 830 against degradation, as to be discussed in the following.

The HV_contorl_1 and HV_contorl_2 signals may be generated using respective control signal generators. The HV_support signal may be generated by a support signal generator. These signal generators can be located in periphery area of a chip. Examples of said signal generators are discussed below, such as with reference to FIGS. 9A-9C. Because the transistor protector circuit 820 uses less transistors (e.g., only HVN 821 and 822) than the compensator circuit 620, overall size of a chip can be substantially reduced.

The signal transfer circuit 830 is a variant of the signal transfer circuit 630 of the HV shifter 600 in FIG. 6. The signal transfer circuit 830 can include a high-voltage NMOS transistor HVD 631B and HVP 641 serially connected and coupled between the high-voltage input "HV_input" and the output "HV_output". The drain of HVD 631B is connected to HV_input, and the drain of HVP 641 is connected to HV_output. The HV_input signal can be transferred to HV_output via HVD 631B and HVP 641. The signal transfer circuit 830 can also be connected to the transistor protector circuit 820 to protect against degradation of HVP 641 associated with an elevated threshold voltage (Vth), such as due to the gate-to-channel stress imposed by high voltages applied to the of HVP 641 during voltage transfer.

Figure 9A:
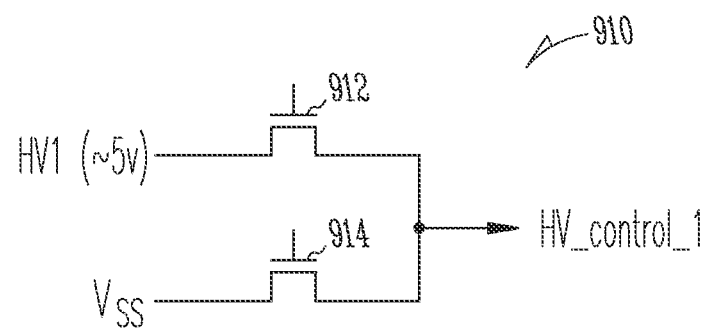
FIGS. 9A-9C are diagrams illustrating examples of signal generators for generating control signals and stress-relief signals for protecting against transistor degradation in a HV shifter.
Figure 9B:
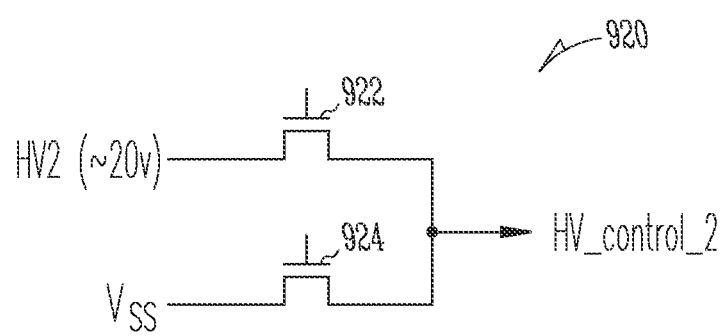
Figure 9C:
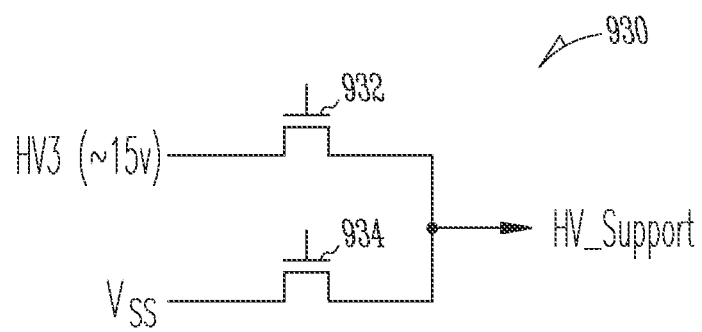

FIGS. 9A-9C are diagrams illustrating examples of the signal generators for generating control signals (HV_control_1 and HV_control_2) and stress-relief signal (HV_support) for reducing PMOS degradation in a HV shifter. These signal generators can each include respective high-voltage multiplexers (MUX's) configured to select between a high voltage source of a specified voltage and a ground potential Vss, and couple the selected voltage to the respective components of the transistor protector circuit 820. The high-voltage source may include a charge pump or an external power supply configured to provide a voltage of specified magnitude. In particular, FIG. 9A illustrates a first high-voltage control circuit (HVC1) 910 that can generate a first control signal HV_control_1, selected between a first high voltage source HV1 and Vss, via respective switches/transistors 912 and 914. The voltage source HV1 can be a charge pump or an external power source. In an example, HV is approximately 5V. During a standby state, the switch/transistor 912 conducts, setting the HV_control_1 to a voltage level of HV1. This high voltage can be used to transfer full Vcc to HVP 641. FIG. 9B illustrates a second high-voltage control circuit (HVC2) 920 that can generate a second control signal HV_control_2, selected between a second high voltage source HV2 (e.g., a charge pump or an external power source) and Vss via respective switches/transistors 922 and 924. In an example, HV2 is approximately 20V. During standby state, the switch/transistor 922 conducts, setting the HV_control_2 to a voltage level of HV2. In an example, HV2 is approximately 20V. This high voltage can be used to transfer the stress-relief signal HV_support (which is approximately at a level of HV3) to HVP 641. FIG. 9C illustrates a high-voltage support circuit (HVS) 930 that can generate a stress-relief signal HV_support, selected between a second high voltage source HV3 (e.g., a charge pump or an external power source) and Vss via respective switches/transistors 932 and 934. In an example, the stress-relief signal is approximately 15V. During a standby state, the switch/transistor 932 conducts, connecting the source HV3 to HV_support. This high voltage can be used to relax the gate-to-channel stress.

Figure 10:
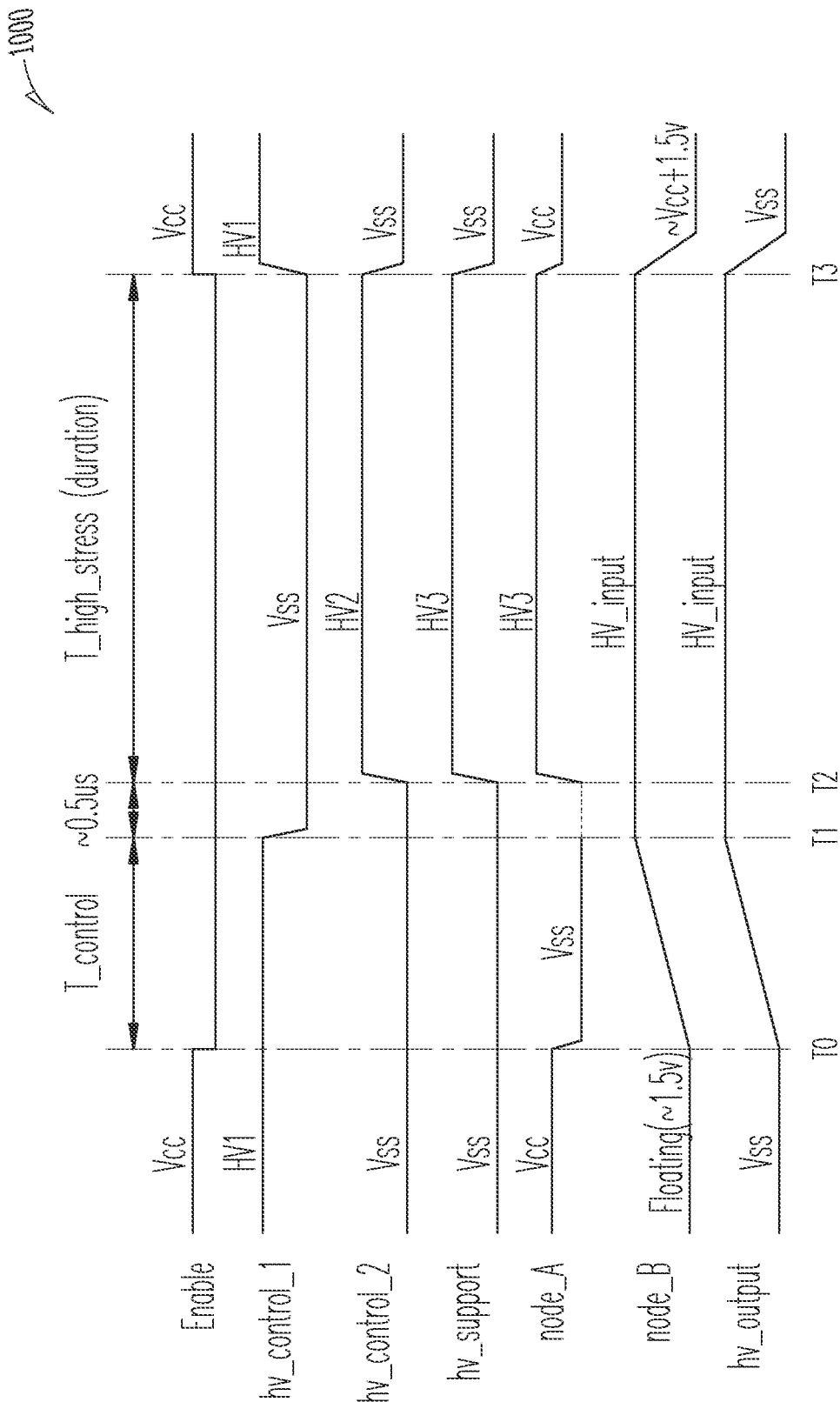
FIG. 10 is timing diagram illustrating an operation of a selected high-voltage shifter.

FIG. 10 is timing diagram 1000 illustrating an operation of a selected HV shifter. A shifter can be selected by setting the "enable" signal to a ground potential Vss. During an initial standby state, the "enable" signal is placed at a logic high potential (Vcc), such that no HV shifter is activated. The control signal HV_control_1 is set to HV1 via the HVC1 910, HV_control_2 and HV_support are both set to Vss via the HVC2 920 and the HVS 930, respectively. As "enable" is high. NMOS 611 conducts and PMOS 612 does not conduct. The voltage at node 618 is at a potential of Vss, thus PMOS 615 conducts and NMOS 614 does not conduct, pulling the voltage at node 812 to a level substantially equal to Vcc. The voltage at 812 is a bias voltage for biasing HVP 641 during the standby state. The gate of HVN 821 is controlled by HV_control_1. The HV1 (e.g., approximately 5V) at HV_control_1 causes HVN 821 to conduct, and the bias voltage at node 812 can be transferred to node_A, raising the voltage at node_A to approximately Vcc. The sufficiently high voltage HV1 at HV_control_1 can ensure that full Vcc is transferred to node_A during the standby state. Meanwhile, NMOS 611 and HVN 651 both conduct, and the gate of HVD 631B is low at Vss. As a result, the source of HVD 631B, which is connected to node_B, is floating at approximately 1.5V due to the negative threshold (approximately −1.5V) of HVD 631B. Because HVN 651 still conducts, the ground potential Vss at node 618 is transferred to the source of HVN 651, setting HV_output to Vss.

At T0, the "enable" signal is flipped to low to select a shifter of interest. The three high-voltage supplies (HV_control_1, HV_control_2, and HV_support) remain unchanged.

The low "enable" signal causes PMOS 612 to conduct and NMOS 611 to close, thereby setting node 618 to a logic high level. This causes PMOS 615 not to conduct, and NMOS 614 to conduct, bringing node 812 to substantially a ground potential Vss. Because the HV_control_1 is set to HV1 and conducts HVN 821, node_A follows the voltage at node 812, and falls to the ground potential Vss, HVP 641, with its gate connected to node_A, then conducts. This causes the HV_output (connected to the drain of HVP 641) to rise in a manner similar to the voltage at node_B. The high voltage at node 618 is transferred to the gate of HVD 631B through the conducted HVN 651, HVD 631B thus conducts, and transfers the input voltage HV_input to the source of HVD 631B and node_B. Through the conducted HVP 641, the high-voltage input HV_input can be transferred to the output port at HV_output. As such, node_B and HV_output both rise until fully reach a value substantially equal to HV_input.

After a specific time period (T_control) that has elapsed from T0, at time instant T1 the control signal HV_control_1 can be switched to the ground potential Vss via the HVC1 910. In an example, the output voltage HV_output can be monitored, and HV_control_1 can be switched from Vcc to Vss in response to the monitored HV_output reaching substantially the input voltage HV_input, the time (T2) at which marks the end of T_control. Following a fall-time of approximately 0.3-0.5 microsecond for the HV_control_1 signal to fall down to Vss, at T2, the other high-voltage source HV_control_2 can be switched to the high-voltage supply HV2 (e.g., approximately 20V) via the HVC2 920, and HV_support can be switched to the high-voltage supply HV3 (e.g., approximately 15V) via the HVS 930. The sufficiently high HV2, when applied to the gate of HVN 822, can cause HVN 822 to conduct and ensure full transfer of the HV_support voltage (which is set to HV3 at the moment) to node_A.

The high voltage (HV3) that is transferred to node_A is applied to the gate of HVP 641, and can put a lot of stress on HVP 641. The HV shifter 800 is brought into a high-stress state. At this time, node_B (connected to the source of HVP 641) and HV_output (connected to the drain of HVP 641) are both at HV_input. The high stress state can last for a specified time period T_high_stress, during which the HV shifter 800 is activated, and the HV_ouput is being supplied to an access line, such as a WL or a GWL. The transferred high voltage can be used to selectively program, erase, or read the one or more memory cells in the memory device. The HV shifter 800 remains active (with the WL and GWL being charged by HV_output to fulfil specified operations on the memory cells), until at T3 the operation is completed and the "enable" signal is reset to Vcc. The three high voltage sources are reset to their respective standby state: HV_control_1 is set to HV1, and HV_control_2 and HV_support are both set to ground potential Vss. High voltage at HVP 641 is then released. Consequently, Node_A flips back to Vcc, and Node_B is discharged through HV_output, which goes to a logic low (the ground potential Vss). The gate of HVP is Vcc (node_A). Because Vth of HVP 641 is −1.5 v, node_B cannot go lower than Vcc+1.5V. HV_output falls back to Vss.

Figure 11:
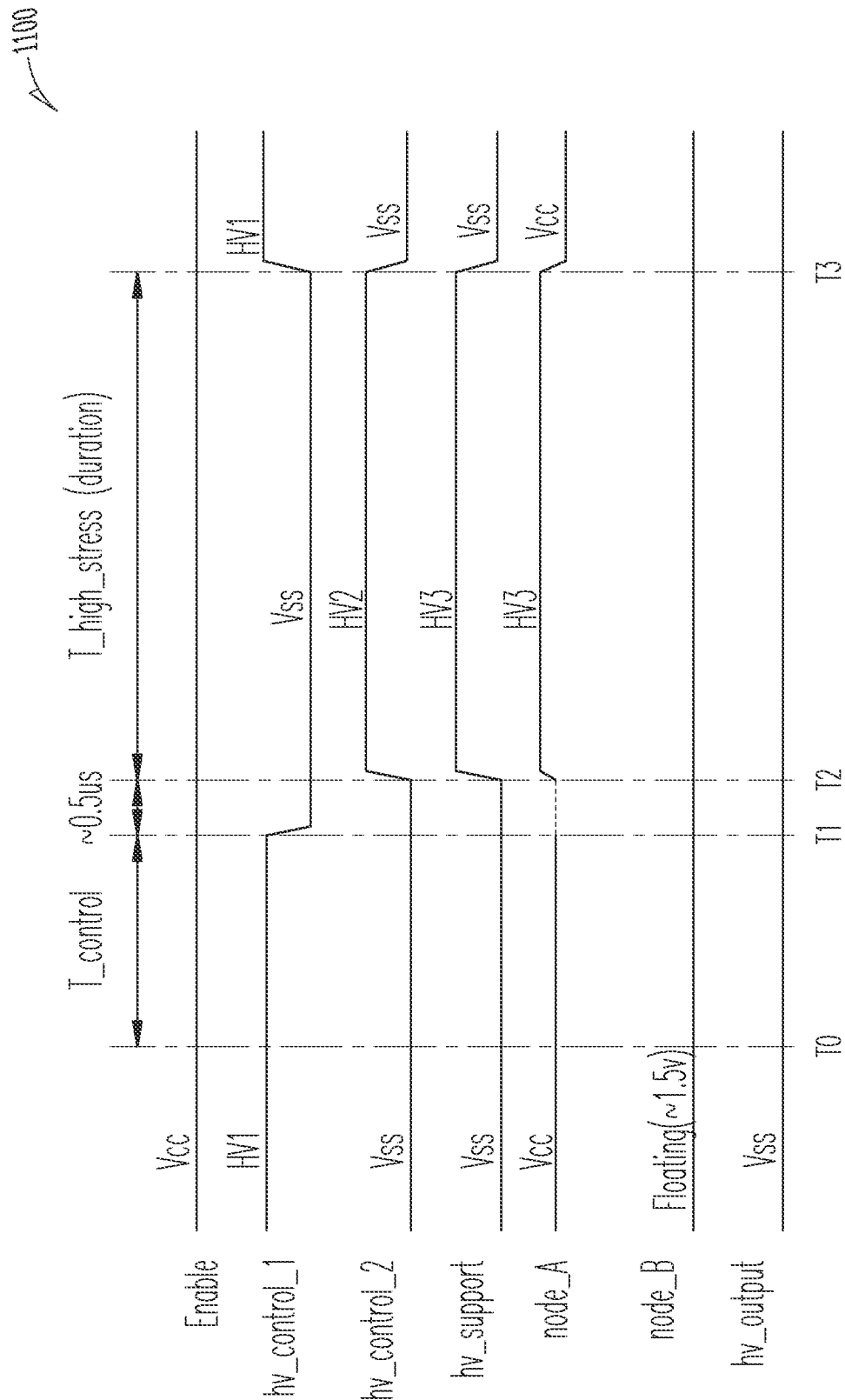
FIG. 11 is timing diagram illustrating an operation of an unselected high-voltage shifter.

FIG. 11 is timing diagram 1100 illustrating an operation of an unselected HV shifter. To unselect a shifter, the "enable" can be maintained at a logic high level (e.g., Vcc). The high-voltage control signals HV_control_1 and HV_contorl_2, and the HV_support signal, can be operatively coupled to the HV shifter 800 using, respectively, the HVC1 910, HVC2 920, and HVS 930, in a manner similar to selected shifter as discussed above with reference to FIG. 10. Note that since "enable" signal stays high for the unselected shifter, no events (e.g., logic state change at one or more components or nodes) would occur during T_control. For example, voltage at node 812, and the voltage at node_A, do not flip to Vss (as is the case for the selected HV shifter, as shown in FIG. 10) due to the "enable" signal is maintained at Vcc until time T1. T_control is shown in FIG. 11 merely for the purpose of comparing to the events timing of a selected shifter as illustrated in FIG. 10.

At T1, HV_contorl_1 is switched from HV1 to the ground potential Vss via the HVC1 910. As discussed above for the selected shifter in reference to FIG. 9, following a 0.3-0.5 μs delay from T1, the voltage sources HV_control_2 and HV_support can be flipped to respective high voltages HV2 and HV3. The sufficiently high HV2 applies to the gate of HVN 822 to ensure full transfer of the HV_support (at a level of HV3) to node_A. The gate of HVP 641, which is connected to node_A, is simply raised up to HV_support (at a level of HV3) in the unselected HV shifter. The high level of HV_support (HV3) at node_A can put a lot of stress on HVP 641. This brings the HV shifter to a high stress state. As shown in FIG. 11, for an unselected HV shifter, Node_B and the HV_output have a voltage profile different from the counterpart of the selected HV shifter as shown in FIG. 10. Because the "enable" signal stays high at Vcc. NMOS 611 conducts and HV_output stays at a logic low level Vss throughout. Node_B stays at floating 1.5V, due to the negative threshold voltage of HVD 631B (approximately −1.5V).

Compared to the HV shifter 600, the HV shifter circuit 800 has several advantages. First, it leads to a reduction in the silicon area occupied by the HV shifter circuit. As shown in FIG. 8, many transistors in the HV shifter 600 can be eliminated (e.g., low-voltage NMOS 613 and 616, and HV transistors 621A-621B. 623, 622, and 631A). A single HV shifter 800 can be shared by multiple memory cell array blocks, thereby reducing the chip layout area. In some examples, the transistor protector circuit 820, including the signal generators HVC1, HVC2, HVS for generating, respectively, the high-voltage signals HV_control_1, HV_control_2, and HV_support, can be placed on periphery area of a chip, and placed only once in a chip and shared by multiple memory cell array blocks. Accordingly, overall size of a chip can be much smaller. Second, the HV shifter 800 provides for a more efficient HV level shifting circuit and method that can effectively protect against degradation of HV transistors in the shifter circuit. In conventional HV shifters, HV_support is used to compensate for transistor degradation in the signal transfer circuit 630, HV_support is typically set to a high level (higher than Vcc) sufficient to operate the degraded HVP 641 with an elevated Vth. Such an HV_support can cause further degradation of HVP 641 over time. In the HV shifter 800, since HV_support is directly supplied to the gate of HVP 641 (via HVN 822), the degradation of HVP 641 due to high-stress can be easily controlled via the HV_support. Such a flexibility of setting HV_support voltage can be beneficial in reducing HVP degradation. For example, in contrast to HV sifter 600 where the HV_support is limited to be low enough to avoid degrading HVP, in HV shifter 600 very high HV_support can be applied, as long as the HV_input exceeds the HV_support by approximately 2V, which is just above the threshold voltage of HVP 641 (approximately 1.5 V). The transistor protector circuit 820 enables a useful technique of linking the HV_support to HV_input, such that when HV_input is increased, HV_support can be adjusted accordingly. In an example, HV_support voltage can be increased proportionally to an increase in HV_input to keep the gate-to-channel stress level under control, thereby relieving or reducing the stress on HVP 641, increasing its threshold, and degrades the voltage translating performance.

Figure 12:
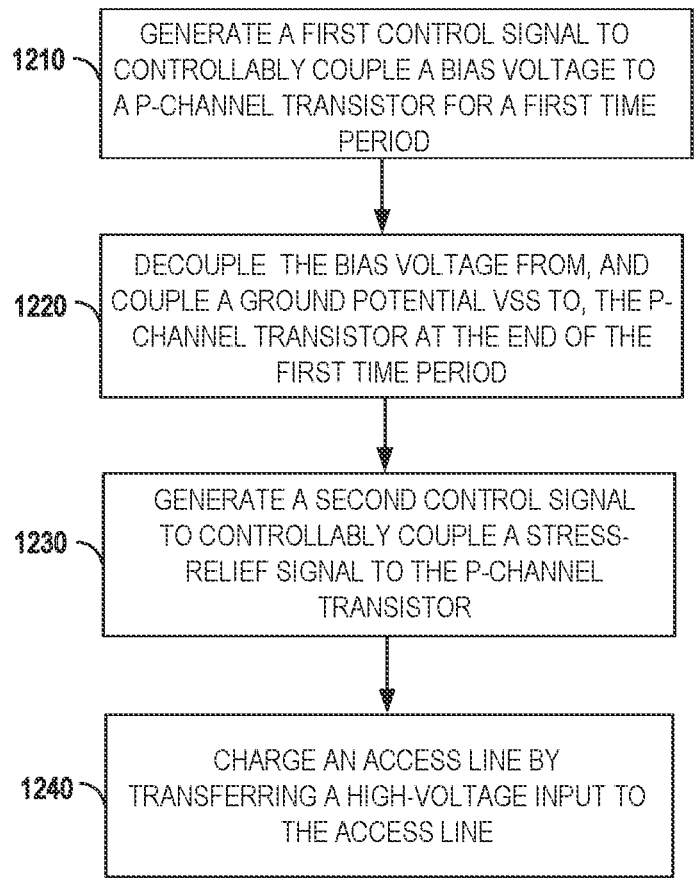
FIG. 12 is a flow chart illustrating a method of addressing transistor degradation in a high-voltage shifter.

FIG. 12 is a flow chart illustrating a method 1200 of addressing degradation of a transistor, such as a PMOS transistor, in a HV shifter that is used to level-shift a digital signal from one power supply to another in a memory device according to one embodiment discussed herein, such as via the HV shifter circuit 800 of FIG. 8. Although the blocks in the method 1200 are shown in a particular order, the order of these steps can be modified. Thus, the illustrated embodiments can be performed in a different order, and some actions/blocks may be performed in parallel. Additionally, one or more actions/blocks can be omitted in various embodiments of level-shifting an input signal from one power supply level to another, such as by using the HV shifter 800. The flowchart of FIG. 12 is illustrated with reference to the embodiments of FIGS. 8-11. In an example, the method 1200 may be implemented in and executed by the HV shifter circuit 800, or embodiments or variants thereof, as discussed above.

The method 1200 commences at 1210 to generate a first control signal to controllably couple a bias voltage to a P-channel transistor in of a HV shifter. The P-channel transistor can be a high-voltage PMOS transistor (such as HVP 641) serially connected to an N-channel transistor (such as HVD 631B) in a signal transfer circuit 830, which is connected between an input port for receiving a high-voltage input and an output port for providing the transferred voltage to an access line, as illustrated in FIG. 8. The first control signal may be generated using the HVC1 910 of FIG. 9A, which can selectively couple to a charge pump or an external power source to provide the first control signal. In an example, the first control signal is approximately 5V. This value of the first control signal can reliably cause a switch transistor (HVN 821) to conduct, such that the bias voltage can be transferred to the P-channel transistor. In an example, the bias voltage has a value of the supply voltage Vcc. The bias voltage at a level of approximately Vcc may be applied to the P-channel transistor for a specified first time period T_control. In an example, T_control can be a predetermined time period. In another example, an output voltage HV_output at the output port can be monitored. The first time period T_control ends at a time when the monitored HV_output reaches substantially the input voltage HV_input.

At 1220, at the end of the first time period T_control, the first control signal can be switched from 5V to a low level of ground potential Vss, such that the bias voltage of Vcc can be decoupled from the P-channel transistor, and a ground potential Vss can be coupled to the P-channel transistor. Following a specified switching delay of approximately 0.3-0.5 microsecond from the end of the first time period, at 1230, a second control signal may be generated, such as using the HVC2 circuit 920, to controllably couple a stress-relief signal to the P-channel transistor. The switching delay is to account for fall-time of HVC1 910 from its initial 5V to a level of Vss. The stress-relief signal can be generated by the HVS circuit 930 of FIG. 9C. In an example, the stress relief signal is substantially 15 Volts. In an example, the second control signal is a high-voltage signal of approximately 20V. The stress relieve signal and the second control signal can each be controllably coupled to a charge pump or an external power source, controlled respectively by the HVS circuit 930 and the HVC2 circuit 920. The second control signal is high enough (20V) to cause HVN 822 to conduct, and to ensure full transfer of the stress-relief signal of 15V to the P-channel transistor. The serially connected HVD 631B and HVP 641 of the signal transfer circuit remains conducted, and the output voltage HV_output can rise and maintain at a level substantially equal to HV_input.

At 1240, one or more access lines may be charged up by transferring the high-voltage input to the access line. The access line, such as a word line (WL) or a global word line (GWL), may be coupled to one or more of the group of memory cells. By charging the WL or GWL to desired voltage, one or more of the group of memory cells may be selectively read, programmed, or erased, among other memory cell operations.

Figure 13:
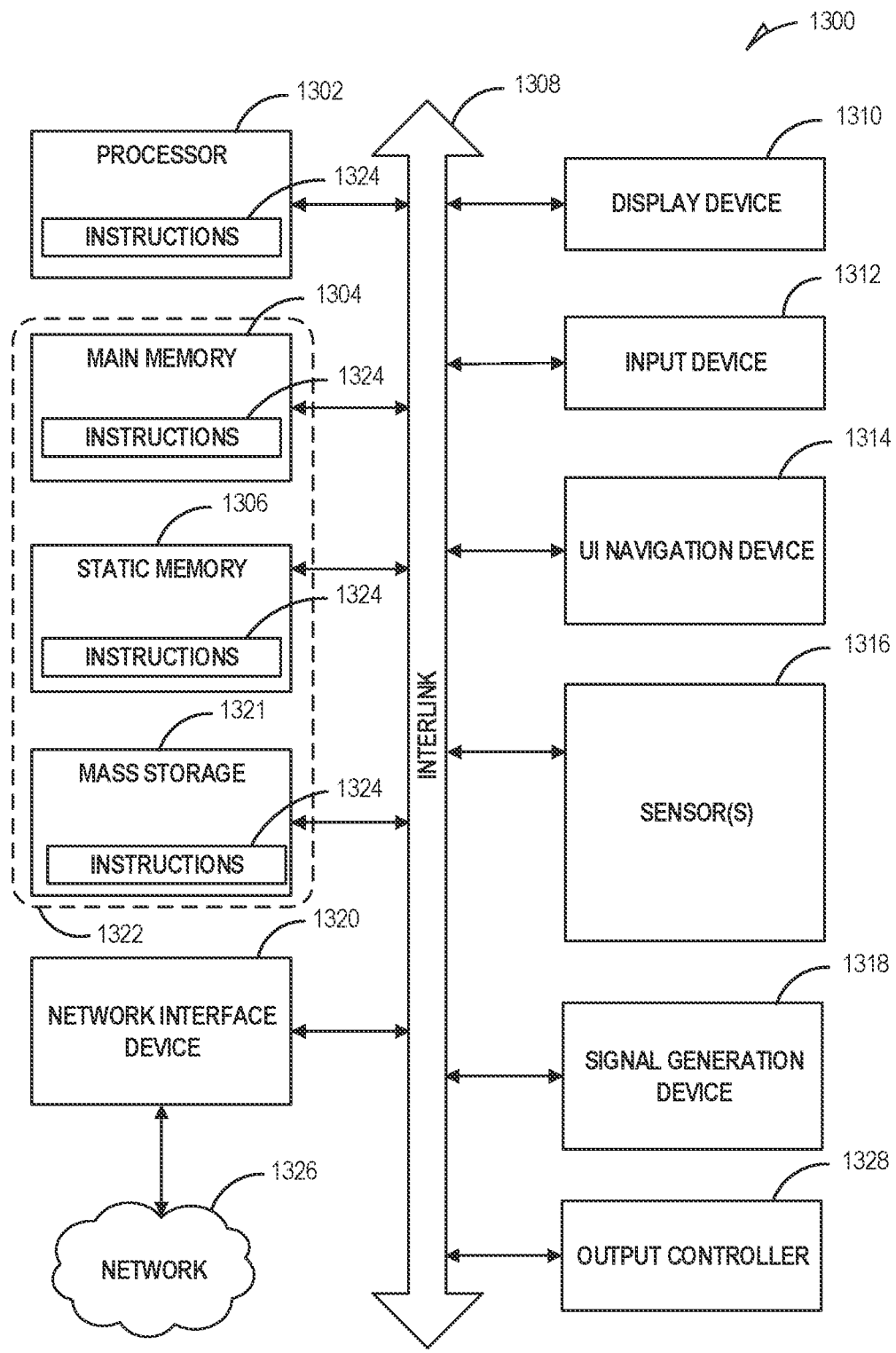
FIG. 13 is a block diagram illustrating an example of a machine upon which one or more embodiments may be implemented.

FIG. 13 illustrates a block diagram of an example machine 1300 upon which any one or more of the techniques (e.g., methodologies) discussed herein may perform. In alternative embodiments, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in peer-to-peer (P2P) (or other distributed) network environment. The machine 1300 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1300 (e.g., the host device 105, the memory device 110, etc.) may include a hardware processor 1302 (e.g., a central processing unit (CPU), a graphics processing unit (GPU), a hardware processor core, or any combination thereof, such as the memory controller 115, etc.), a main memory 1304 and a static memory 1306, some or all of which may communicate with each other via an interlink (e.g., bus) 1308. The machine 1300 may further include a display unit 1310, an alphanumeric input device 1312 (e.g., a keyboard), and a user interface (UI) navigation device 1314 (e.g., a mouse). In an example, the display unit 1310, input device 1312 and UI navigation device 1314 may be a touch screen display. The machine 1300 may additionally include a signal generation device 1318 (e.g., a speaker), a network interface device 1320, and one or more sensors 1316, such as a global positioning system (GPS) sensor, compass, accelerometer, or other sensor. The machine 1300 may include an output controller 1328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1300 may include a machine readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within static memory 1306, or within the hardware processor 1302 during execution thereof by the machine 1300. In an example, one or any combination of the hardware processor 1302, the main memory 1304, or the static memory 1306 may constitute the machine readable medium 1322.

While the machine readable medium 1322 is illustrated as a single medium, the term "machine readable medium" may include a single medium or multiple media (e.g., a centralized or distributed database, or associated caches and servers) configured to store the one or more instructions 1324.

The term "machine readable medium" may include any medium capable of storing or encoding instructions for execution by the machine 1300 and that cause the machine 1300 to perform any one or more of the techniques of the present disclosure, or capable of storing, encoding or carrying data structures used by or associated with such instructions. Non-limiting machine readable medium examples include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1324 (e.g., software, programs, an operating system (OS), etc.) or other data are stored on the storage device 1321, can be accessed by the memory 1304 for use by the processor 1302. The memory 1304 (e.g., DRAM) is typically fast, but volatile, and thus a different type of storage than the storage device 1321 (e.g., an SSD), which is suitable for long-term storage, including while in an "off" condition. The instructions 1324 or data in use by a user or the machine 130 are typically loaded in the memory 1304 for use by the processor 1302. When the memory 1304 is full, virtual space from the storage device 1321 can be allocated to supplement the memory 1304; however, because the storage 1321 device is typically slower than the memory 1304, and write speeds are typically at least twice as slow as read speeds, use of virtual memory can greatly reduce user experience due to storage device latency (in contrast to the memory 1304, e.g., DRAM). Further, use of the storage device 1321 for virtual memory can greatly reduce the usable lifespan of the storage device 1321.

In contrast to virtual memory, virtual memory compression (e.g., the Linux® kernel feature "ZRAM") uses part of the memory as compressed block storage to avoid paging to the storage device 1321. Paging takes place in the compressed block until it is necessary to write such data to the storage device 1321. Virtual memory compression increases the usable size of memory 1304, while reducing wear on the storage device 1321.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMCT™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1324 may further be transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®. IEEE 802.16 family of standards known as WiMax®). IEEE 802.15.4 family of standards, peer-to-peer (P2P) networks, among others. In an example, the network interface device 1320 may include one or more physical jacks (e.g., Ethernet, coaxial, or phone jacks) or one or more antennas to connect to the communications network 1326. In an example, the network interface device 1320 may include a plurality of antennas to wirelessly communicate using at least one of single-input multiple-output (SIMO), multiple-input multiple-output (MIMO), or multiple-input single-output (MSO) techniques. The term "transmission medium"

shall be taken to include any intangible medium capable of storing, encoding or carrying instructions for execution by the machine 1300, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms"first." "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on." "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a memory device that comprises a group of memory cells and a high-voltage shifter circuit. The high-voltage shifter circuit can include a signal transfer circuit, and first and second high-voltage control circuits. The signal transfer circuit includes a P-channel transistor coupled between an input port and an output port of the high-voltage shifter circuit, the P-channel transistor configured to transfer a high-voltage input received at the input port to an access line controllably coupled to one or more of the group of memory cells. The first high-voltage control (HVC1) circuit is configured to controllably couple a bias voltage to the P-channel transistor for a first time period. The second high-voltage control (HVC2) circuit configured to controllably couple a stress-relief signal to the P-channel transistor for a second time period, after the first time period, to protect against degradation of the P-channel transistor.

In Example 2, the subject matter of Example 1 optionally includes the signal transfer circuit that further includes an N-channel transistor having a gate coupled to the control signal. The N-channel transistor and the P-channel transistor can be serially connected and coupled between the input port and the output port of the high-voltage shifter circuit.

In Example 3, the subject matter of Example 2 optionally includes the P-channel transistor that can be a high-voltage PMOS transistor with a positive threshold voltage. The N-channel transistor can be a high-voltage NMOS transistor with a negative threshold voltage.

In Example 4, the subject matter of any one or more of Examples 1-3 optionally include the HVC1 circuit that can be configured to, at an end of the first time period, decouple the bias voltage from the P-channel transistor and couple a ground potential (Vss) to the P-channel transistor; and the HVC2 circuit that can be configured to, after a specified switching delay from the end of the first time period, couple the stress-relief signal to the P-channel transistor.

In Example 5, the subject matter of any one or more of Examples 1-4 optionally includes the HVC1 circuit that can be configured to decouple the bias voltage from, and to couple to the ground potential (Vss) to, the P-channel transistor in response to an output voltage at the output port substantially reaching a value of the high-voltage input at the input port.

In Example 6, the subject matter of any one or more of Examples 1-5 optionally includes the HVC1 circuit that can be coupled to a gate of a first N-channel transistor. The first N-channel transistor has a source connected to a gate of the P-channel transistor.

In Example 7, the subject matter of Example 6 optionally includes the bias voltage that can have a value substantially equal to a supply voltage (Vcc).

In Example 8, the subject matter of any one or more of Examples 1-7 optionally includes a high-voltage support (HVS) circuit configured to generate the stress-relief signal, and to couple the stress-relief signal to a drain of a second N-channel transistor. The HVC2 circuit can be coupled to a gate of the second N-channel transistor to control the transfer of the stress-relief signal to the gate of P-channel transistor.

In Example 9, the subject matter of Example 8 optionally includes the HVS circuit that can include a multiplexer configured to switch between a high-voltage source and a ground potential (Vss).

In Example 10, the subject matter of any one or more of Examples 8-9 optionally includes the high-voltage source of the HVS circuit that can have a voltage proportional to the high-voltage input.

In Example 11, the subject matter of any one or more of Examples 1-10 optionally includes the HVC1 circuit that can include a multiplexer configured to switch between a first voltage source and a ground potential (Vss).

In Example 12, the subject matter of any one or more of Examples 1-11 optionally includes the HVC2 circuit that can include a multiplexer configured to switch between a second voltage source and a ground potential (Vss).

In Example 13, the subject matter of any one or more of Examples 1-12 optionally includes the access line that can be configured to connect to the output port of the high-voltage shifter circuit, and the signal transfer circuit that can be configured to charge the access line using the transferred high-voltage input.

In Example 14, the subject matter of any one or more of Examples 1-13 optionally includes the access line that can include a word line or a global word line.

Example 15 is a method of addressing potential degradation of a P-channel transistor of a signal transfer circuit in a high-voltage shifter of a memory device comprising a group of memory cells. The method comprises steps of, in response to a shifter enabling signal: generating a first control signal using a first high-voltage control (HVC1) circuit to controllably couple a bias voltage to the P-channel transistor for a first time period, and at an end of the first time period, to decouple the bias voltage from, and couple to a ground potential (Vss) to, the P-channel transistor, generating a second control signal using a second high-voltage control (HVC2) circuit to controllably couple a stress-relief signal to the P-channel transistor after a specified switching delay from the end of the first time period to protect the P-channel transistor against degradation; and charging an access line, via the signal transfer circuit, by transferring a high-voltage input to the access line coupled to one or more of the group of memory cells.

In Example 16, the subject matter of Example 15 optionally includes monitoring an output voltage of the high-voltage shifter, and decoupling the P-channel transistor from the bias voltage and coupling to a ground potential (Vss) in response to the output voltage substantially reaching a value of the high-voltage input.

In Example 17, the subject matter of any one or more of Examples 15-16 optionally include: generating the stress-relief signal using a high-voltage support (HVS) circuit; coupling the stress-relief signal to a drain of a second N-channel transistor; and coupling the HVC2 circuit to a gate of the second N-channel transistor to controllably transfer the stress-relief signal to the gate of P-channel transistor.

In Example 18, the subject matter of any one or more of Examples 15-17 optionally include the first control signal that can be substantially 5 Volts, the second control signal that can be substantially 20 Volts, and the stress relief signal that can be substantially 15 Volts.

In Example 19, the subject matter of any one or more of Examples 15-18 optionally includes the P-channel transistor that can be a high-voltage PMOS (HVP) transistor.

In Example 20, the subject matter of any one or more of Examples 15-19 optionally includes the access line that can include a word line or a global word line, and applying the transferred high-voltage input to program, erase, or read the one or more of the group of memory cells.

The invention claimed is:

1. A voltage shifter for transferring a high-voltage input to memory cells in a memory device, the voltage shifter comprising:
an input port to receive the high-voltage input;
an output port coupled to one or more of the memory cells via an access line;
a high-voltage transistor coupled between the input port and the output port; and
a transistor protection circuit, including at least one multiplexer configured to:
couple a bias voltage to the high-voltage transistor until a specific condition is satisfied; and
after satisfaction of the specific condition, decouple the bias voltage from the high-voltage transistor, and couple a stress-relief signal to the high-voltage transistor to protect the high-voltage transistor from degradation due to a gate-to-channel stress during the transferring of the high-voltage input from the input port to the output port.

2. The voltage shifter of claim 1, wherein the specific condition includes expiration of a time period for coupling the bias voltage to the high-voltage transistor.

3. The voltage shifter of claim 1, wherein the specific condition includes a monitored voltage at the output port satisfying a condition relative to the high-voltage input received at the input port.

4. The voltage shifter of claim 3, wherein the specific condition includes the monitored voltage at the output port substantially reaching a value of the high-voltage input at the input port.

5. The voltage shifter of claim 1, wherein the high-voltage transistor includes a first P-channel transistor or a first N-channel transistor.

6. The voltage shifter of claim 1, wherein the high-voltage transistor includes a first P-channel transistor and a first N-channel transistor connected in series and coupled between the input port and the output port.

7. The voltage shifter of claim 1, comprising a shifter selector circuit configured to couple a shifter enabling signal to an inverter to enable the voltage transfer from the input port to the output port in response to a first state of the shifter enabling signal, and to disable the voltage transfer in response to a different second state of the shifter enabling signal.

8. The voltage shifter of claim 7, wherein the inverter includes a second P-channel transistor and a second N-channel transistor connected in parallel and coupled to the output port via a third N-channel transistor.

9. The voltage shifter of claim 1, wherein the at least one multiplexer includes a first digital switch configured to:
switch to a first high-voltage source providing the bias voltage to the high-voltage transistor until the specific condition is satisfied; and
upon the satisfaction of the specific condition, decouple the bias voltage from, and couple a ground potential (Vss) to, the high-voltage transistor.

10. The voltage shifter of claim 9, wherein the bias voltage has a value substantially equal to a supply voltage (Vcc).

11. The voltage shifter of claim 1, wherein the at least one multiplexer includes a second digital switch configured to:
couple a ground potential (Vss) to the high-voltage transistor until the specific condition is satisfied; and
after a specified switching delay from the satisfaction of the specific condition, decouple the bias voltage from the high-voltage transistor, and switch to a second high-voltage source providing the stress-relief signal to the high-voltage transistor.

12. The voltage shifter of claim 11, wherein the second high-voltage source has a voltage proportional to the high-voltage input.

13. The voltage shifter of claim 11, wherein the at least one multiplexer includes a third digital switch configured to switch between a ground potential (Vss) and a third high-voltage source providing a control signal for controlling transfer of the stress-relief signal.

14. The voltage shifter of claim 1, wherein the access line includes a word line or a global word line, and wherein the voltage shifter is configured to transfer the high-voltage input via the word line or the global word line to the one or more of the memory cells to perform a memory operation.

15. A memory device, comprising:
a group of memory cells; and
a voltage shifter circuit, including:
an input port;
an output port;
a high-voltage transistor coupled between the input port and the output port and configured to transfer a high-voltage input received at the input port to one or more access lines coupled between the output port and one or more of the group of memory cells, the transferred high-voltage input being applied to the one or more memory cells to perform a memory operation;
a transistor protection circuit including at least one multiplexer configured to couple a bias voltage to the high-voltage transistor until a specific condition is satisfied, and, after satisfaction of the specific condition, to decouple the bias voltage from the high-voltage transistor and couple a stress-relief signal to the high-voltage transistor to protect the high-voltage transistor from degradation due to a gate-to-channel stress during the transferring of the high-voltage input from the input port to the output port; and
a shifter control circuit configured to couple a shifter enabling signal to an inverter to enable the voltage transfer from the input port to the output port in response to a first state of the shifter enabling signal, and to disable the voltage transfer in response to a different second state of the shifter enabling signal.

16. The memory device of claim 15, wherein the access line includes a word line or a global word line, and the voltage shifter is configured to use the transferred high-voltage input to perform the memory operation including programming, erasing, or reading one or more memory cells coupled to the word line or the global word line.

17. The memory device of claim 15, wherein the high-voltage transistor includes a first P-channel transistor and a first N-channel transistor connected in series and coupled between the input port and the output port.

18. The memory device of claim 15, wherein the inverter includes a second P-channel transistor and a second N-channel transistor connected in parallel and coupled to the output port via a third N-channel transistor.

19. The memory device of claim 15, wherein the specific condition includes expiration of a time period for coupling the bias voltage to the high-voltage transistor.

20. The memory device of claim 15, wherein the specific condition includes a monitored voltage at the output port satisfying a condition relative to the high-voltage input received at the input port.

* * * * *